United States Patent [19]
Moser

[11] 4,287,603
[45] Sep. 1, 1981

[54] RADIATED INPUT MIXER

[75] Inventor: Kenneth R. Moser, South Bend, Ind.

[73] Assignee: The Bendix Corporation, Teterboro, N.J.

[21] Appl. No.: 69,197

[22] Filed: Aug. 23, 1979

[51] Int. Cl.³ .............................................. H04B 1/26
[52] U.S. Cl. ................... 455/293; 455/327; 455/330; 455/331
[58] Field of Search ............... 455/293, 294, 318, 319, 455/323, 325, 326, 327, 330, 331; 343/895

[56] References Cited

U.S. PATENT DOCUMENTS

| | | | |
|---|---|---|---|
| 2,608,650 | 8/1952 | Myers | 455/331 |
| 3,509,465 | 4/1970 | Andre et al. | 455/343 |
| 3,652,941 | 3/1972 | Neuf | 455/327 |
| 3,787,871 | 1/1974 | Reese | 343/895 |
| 4,032,849 | 6/1977 | Gysel et al. | 455/325 |
| 4,063,176 | 12/1977 | Milligan et al. | 455/326 |

Primary Examiner—Marc E. Bookbinder
Attorney, Agent, or Firm—Anthony F. Cuoco; Vett Parsigian

[57] ABSTRACT

A radiated input mixer for converting a radio frequency (RF) signal into an intermediate frequency (IF) signal with the aid of a local oscillator (LO) signal includes, in combination, an antenna having balanced feed terminals, a diode quad, and a balun with balanced terminals orthogonally positioned with respect to the antenna terminals to provide a less complex and more efficient device of the type described than has heretofore been known in the art.

13 Claims, 18 Drawing Figures

RING

*FIG. 5B*

BRIDGE LO OPPOSED
(BLO)

*FIG. 5C*

BRIDGE RF OPPOSED
(BRO)

RADIATED INPUT MIXER

FIELD OF THE INVENTION

This invention relates to a device for converting a radio frequency signal to an intermediate frequency signal with the aid of a local oscillator signal. More particularly, this invention relates to a device of the type described which accomplishes the signal conversion in a simpler and more efficient manner than has heretofore been possible.

DESCRIPTION OF THE PRIOR ART

The radiated input mixer herein disclosed is a device which converts radiated radio frequency (RF) signals to intermediate frequency (IF) signals with the aid of local oscillator (LO) signals. The frequency relation of the aforenoted signals is such that the sum and difference of the frequencies of any two signals is equal to the possible frequencies of the third. This is known variously, depending on the relationships of the input and output signals, as superheterodyning, up-converting, down-converting, modulating, multiplying, mixing, and phase detecting.

In the prior art, the mixing as it will hereinafter be referred to, is accomplished by a device including means for applying and/or separating the RF, IF and LO signals from a non-linear device, while the RF signal is received (or transmitted) by a separate reciprocal device (an antenna) which converts a plane wave signal to a signal confined to an arrangement of conductors known as a transmission line or waveguide.

A specific kind of mixer is known as a doubly balanced mixer in which signals are supplied to four non-linear elements (a diode quad). Generally, these non-linear elements are semi-conductor diodes arranged in bridge, ring or star configurations.

A specific kind of broadband antenna is a two armed spiral antenna by which the RF signal is transformed to a balanced, two wire, output (feed when used as an emitter) terminal. Usually, the two wire output terminal is converted to a coaxial waveguide with a device known as a balun (balanced to unbalanced mode converter).

The present invention discloses an arrangement providing in combination an antenna having balanced feed terminals, a diode quad and a balun having balanced terminals orthogonally positioned with respect to the antenna terminals so that the aforenoted transformation and conversion is accomplished more efficiently and more simply than has heretofore been possible.

SUMMARY OF THE INVENTION

This invention contemplates means whereby the conditions necessary for providing a broadband radiated input mixer are present at the juncture of the feed terminals of a two arm spiral antenna, and a balun. That is, orthogonal balanced, two wire transmission lines carry the RF and LO signals; the RF two wire line being the spiral antenna itself; and the LO two wire line being a balun from the back of the antenna. A diode quad in a bridge or ring configuration is disposed on the end of the balun which is of the microstrip tapered type. Two opposite leads of the diode quad are connected to the balun and two perpendicular leads are connected to the antenna to achieve the necessary orthogonality of a doubly balanced arrangement which provides broadband isolation between the RF signal port (spiral antenna) and the LO signal port (balun feed). Depending on the polarity of the diodes in the quad and the disposition of frequency sensitive connections between the antenna arms and balun wires, the IF signal may be developed between the antenna arms as a two terminal pair, the balun coaxial terminals, or a two terminal pair including the connected antenna arms as one terminal and the connected balun leads as the other terminal. The IF signal is decoupled from the RF and LO lines when necessary by making use of the radiative filtering properties of the spiral antenna or by building diplexing filters into the LO line. These arrangements, when tailored to a specific application, allow increased efficiency and reduced size and complexity as compared to prior art devices.

DESCRIPTION OF THE INVENTION

Figure 1:
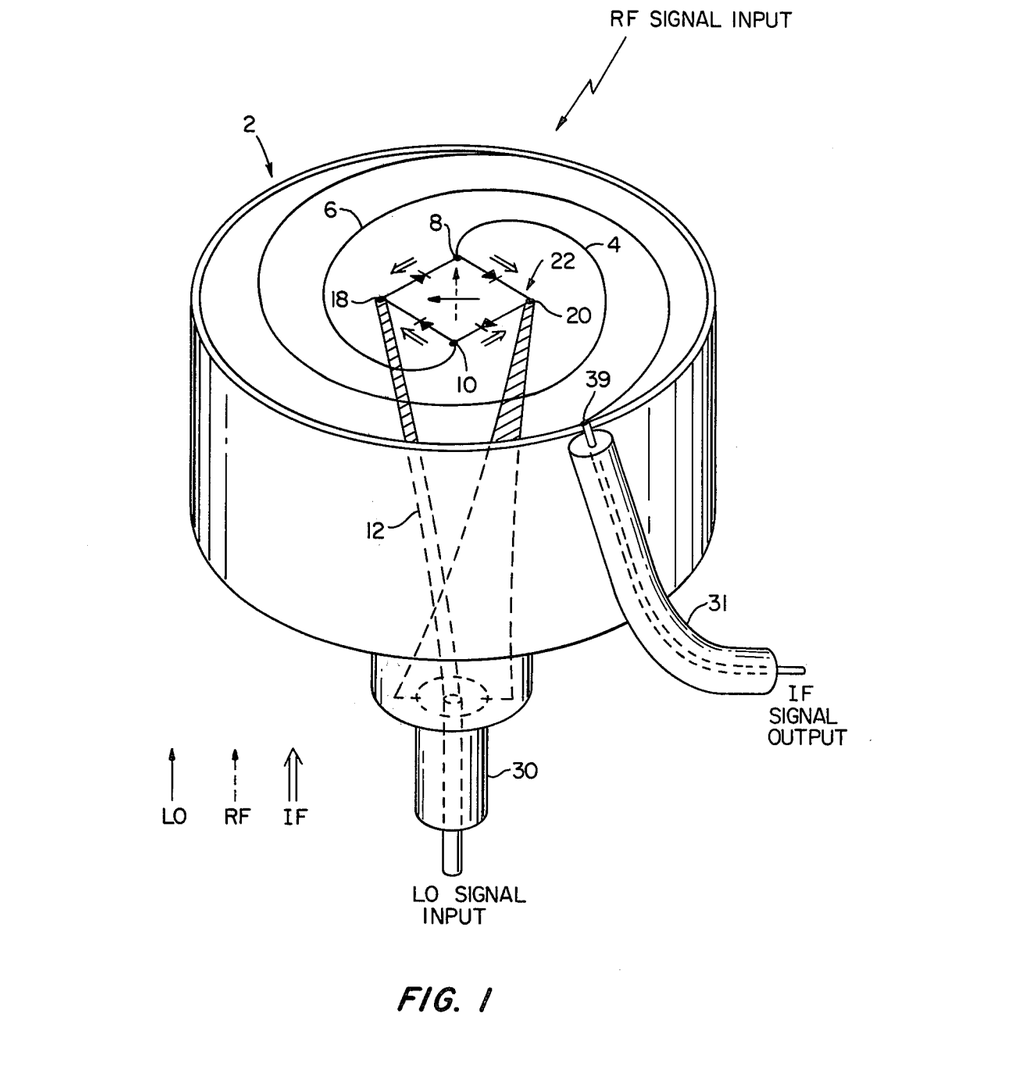
FIG. 1 is a diagrammatic representation generally showing the radiated input mixer according to the invention.

With reference first to FIG. 1, the device of the invention is shown as generally including a spiral antenna designated by the numeral 2 and having a pair of arms 4 and 6 leading from balanced antenna feed terminals 8 and 10, respectively.

A balun (balanced to unbalanced mode converter) 12, which may be of the microstrip tapered type, has terminals 18 and 20 orthogonally positioned with respect to antenna terminals 8 and 10. A diode quad designated generally by the numeral 22, and which will be hereinafter more fully described, is disposed on the end of tapered balun 12, with opposite leads connected to balun terminals 18 and 20 and perpendicular leads connected to antenna terminals 8 and 10.

Thus, it can be seen that orthogonally balanced two wire transmission lines are made to carry a radio frequency (RF) input signal and a local oscillator (LO) input signal applied over a coaxial cable 30. In other words, the RF two wire line is spiral antenna 2, while the LO two wire line is balun 12 from the back of the antenna. This arrangement features a pair of opposite leads of diode quad 22 folded back on the balun and a perpendicular pair of leads connected to the balanced two arm antenna 2 as will now be understood. Thus, the necessary orthogonality of a double balanced geometric configuration is present which provides broadband isolation between the RF signal port (spiral antenna 2) and the LO port (balun feed 30).

Phase relationships are such that the IF signal output is present between spiral antenna arms 4 and 6 and the balun wires. Since one side of the balun is coaxial ground as will be seen from FIG. 1, the IF signal is developed between ground and the inner conductor of a coaxial line connected to the outer ends of the spiral arms at 39. Such an IF connection is decoupled from the RF terminals by the filtering action of the spiral geometry and from the LO terminals by orthogonality. The IF signal output can then be taken from a coaxial transmission line 31 coming off the periphery of the antenna, at a negligible size penalty to the overall mixer configuration.

Figure 2:
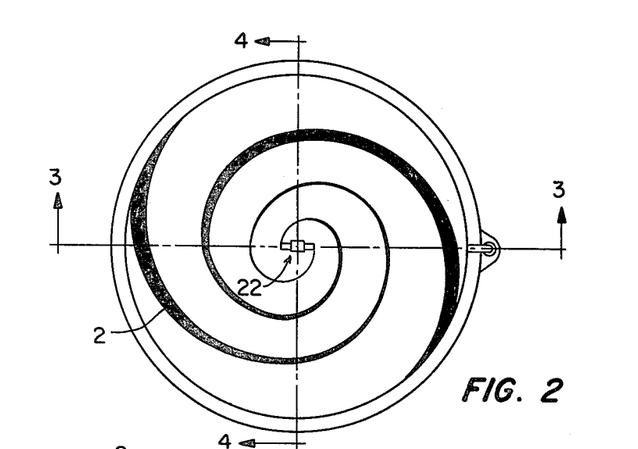
FIG. 2 is a diagrammatic top plan view particularly showing the radiated input mixer shown generally in FIG. 1.
Figure 3:
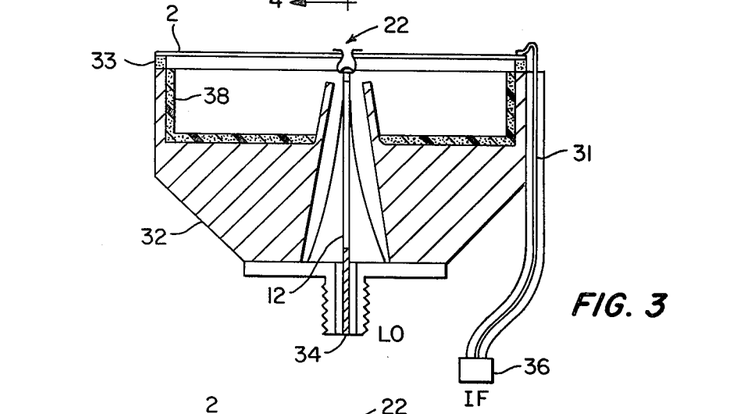
FIG. 3 is a sectional view taken along line 3—3 in FIG. 2.
Figure 4:
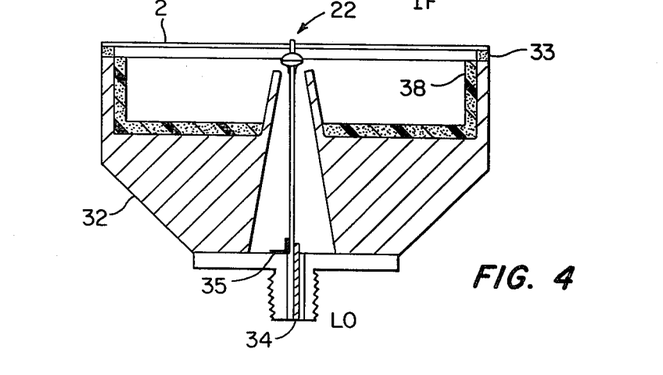
FIG. 4 is a sectional view taken along line 4—4 in FIG. 2.

The configuration shown generally in FIG. 1 is more particularly shown in FIGS. 2, 3 and 4. Thus, spiral antenna 2 is in the form of a copper etching on a dielectric board carried by a conductive cavity 32 and separated therefrom by a dielectric spacer 33. An RF absorber 38 is disposed in the cavity, as is required to attenuate undesirable RF modes. The LO signal is inputted to cable 30 via a coaxial connector 34, to the tapered line balun 12 including copper etchings on both sides of a thin dielectric substrate. The wider track of the balun is soldered to coaxial ground via L-strip 35, and the remaining track is soldered to the pin of connector 34. The IF signal is outputted from cable 31, coming from the outer periphery of antenna 2, via a connector 36.

The invention as so far described features integrating a balanced diode quad into a two arm spiral antenna. It will be recognized by those skilled in the art, that the coupling of the antenna to the IF terminals, by the diode quad directly without recourse to intervening RF networks, provides a potential for better conversion efficiency than has heretofore been possible by way of a receiver using separate antenna and doubly balanced mixer assemblies.

Figure 5A:
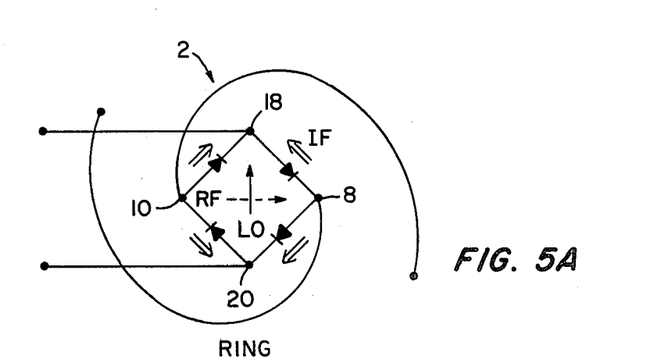
FIGS. 5A, 5B and 5C show diode quad configurations of the RING, bridge LO opposed (BLO) and bridge RF opposed (BRO) configurations, respectively, as may be used with the invention.
Figure 5B:
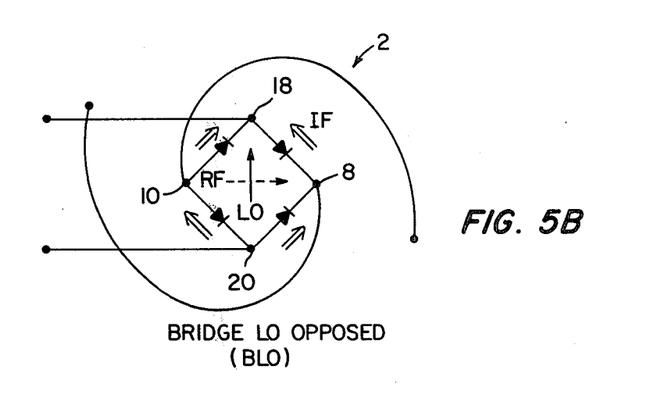
Figure 5C:
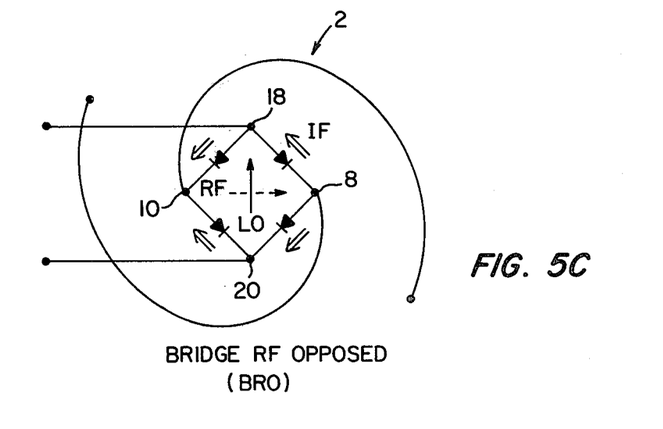

As heretofore referred to, the diode quad may be fabricated in a variety of configurations. FIGS. 5A, 5B and 5C illustrate three configurations which may be used with the invention, with vector representations of the LO, RF and IF signals being as indicated in the FIGS., which will next be described.

In this connection it is noted that the LO and RF signal vectors are in space quadrature by virtue of the cross position of the balun carrying the LO signal and the beginning of the spiral arms, as will be understood with reference to FIGS. 1, 3 and 4. This geometric property, plus the balance of the diodes, is determinative of the degree of isolation between RF and LO ports of the mixer of the invention. Further, the convention is that the RF and LO signal vectors are in phase in the reference position used. It follows, then, that if the geometric projections of the signal vectors on a particular diode are aiding, a positive IF signal will be directed along the conducting direction of the diode, and vice versa. In deference to the polarities of the diodes which determine the two most common configurations of quad, known as "bridge" and "ring", the configuration of FIG. 5A is designated as RING, the configuration of FIG. 5B is designated as BLO (Bridge Lo Opposed), and the configuration of FIG. 5C is designated as BRO (Bridge RF Opposed). It will be observed that the IF signal is developed across different terminals in the different configurations.

Thus, with reference to FIG. 5A which is illustrative of the RING configuration, the IF signal is developed between terminals 18 and 20 as one terminal and 8 and 10 as another terminal. The configuration is then that which has been particularly described with reference to FIGS. 1-4. In the BLO configuration illustrated in FIG. 5B, the IF signal is developed between terminals 18 and 20, the LO terminals, while in the BRO configuration illustrated in FIG. 5C the IF signal is developed, in a complementary manner, between terminals 10 and 8, the FR terminals.

The RING, BLO and BRO configurations have the common attributes of the LO two wire transmission line feed and the RF spiral antenna feed. The LO two wire transmission line feed has a balanced mode characteristic impedance which matches the diode quad, which likewise matches the spiral antenna feed. The unbalanced mode impedance of one side of the line to the spiral cavity ground is quite low. In fact, it is a short circuit to the outer conductor of coaxial connector 34 at lower frequencies (FIGS. 3 and 4).

The other conductor of the LO line may have a high or low unbalanced impedance to ground depending on the balun configuration chosen. For the type of tapered line balun illustrated particularly in FIGS. 1, 3 and 4, it is a high impedance and for other types of balun it is a short. In this latter regard reference is made to FIGS. 2 and 4 of U.S. Pat. No. 4,012,744, issued to Greiser on Mar. 15, 1977.

Figure 6A:
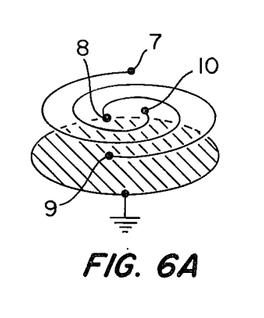
FIGS. 6A and 6B are diagrammatic representations illustrating the nature of the spiral antenna of the invention as a transmission line at frequencies below its radiating band.
Figure 6B:
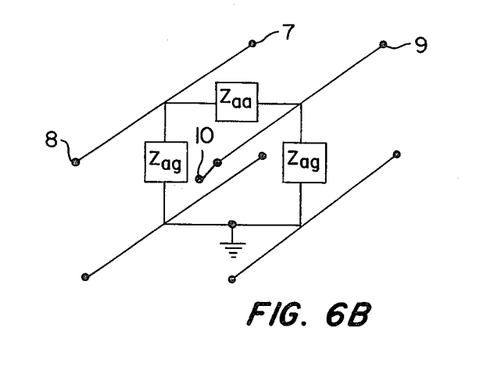

In addition to filtering and wide band radiation (or reception) properties of spiral antenna 2, it is well to consider the nature of the spiral as a transmission line from the diode quad to the antenna periphery at frequencies below its radiating band. This characteristic is illustrated in FIGS. 6A and 6B.

Thus, two arm spiral antenna 2 can be considered a four port network having two non-uniform transmission lines over ground (cavity 32, FIGS. 3 and 4). There is a non-uniform impedance $Z_{qa}$ from arm to arm and a non-uniform impedance $Z_{aa}$ from a single arm to ground. If the spiral is excited in a balanced mode between ports 8 and 10, with a balanced load between ports 7 and 9, it will have an input impedance related to $Z_{aa}$ in parallel with $2\ Z_{ag}$. If it is excited in an unbalanced mode, with ports 8 and 10 shorted and ports 7 and 9 shorted, and a potential applied between ports 8 and 10 and ground with a load between ports 7 and 9 and ground, the input impedance is related to $\frac{1}{2}\ Z_{ag}$. Thus, there can be a great deal of difference between the transmission line characteristics of the spiral of IF frequencies depending on the diode quad configuration.

It is well known that for a diode to function as a mixer, there must be a direct current return path which allows the diode to conduct an average current in its forward direction. The direct current return paths are, therefore, another attribute in which the three configurations vary. Accordingly, particular characteristics of each diode quad configuration will next be discussed.

Figure 7A:
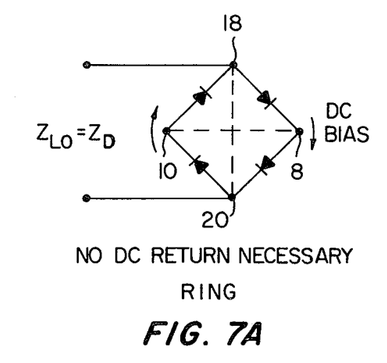
FIGS. 7A, 7B and 7C are diagrammatic representations illustrative of a comparison of the LO signal ports of the RING, BLO and BRO diode quad configurations shown in FIGS. 5A, 5B and 5C, respectively.
Figure 7B:
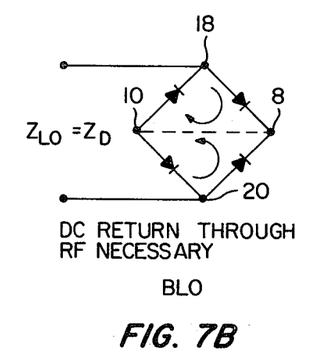
Figure 7C:
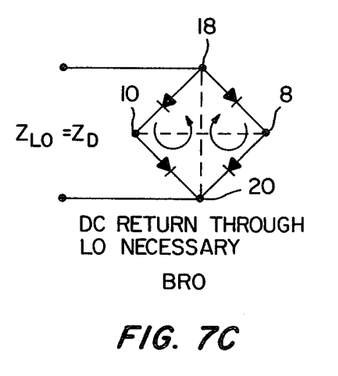

The DC return requirements and input impedance at the LO frequency of the several diode quad configurations will be compared with reference to FIGS. 7A, 7B and 7C. It will be seen that the RING configuration (FIG. 7A) needs no additional DC return for DC diode self-bias current (indicated by the arrows) to flow. However as previously noted, to provide the maximum available output power to a matched IF load, terminals 8 to 10 and 18 to 20 must be shorted at the IF frequency. It is not necessarily true that this implies a short at DC between those terminals, but at low IF frequencies, a short covering DC to IF is much simpler to implement than a bandpass short. Therefore, those terminals are shown connected by a broken line, signifying a DC connection.

The BLO configuration (FIG. 7B), on the other hand, must provide a DC return across the RF terminals for the diodes to self-bias, and the currents can be seen to be common to two diodes.

The BRO configuration (FIG. 7C) must provide a DC return across the LO terminals 18 and 20, and because of the need for a balanced transformer across the RF terminals to extract the IF signal, it is convenient to have a DC return across the RF terminals as shown.

Viewed from the LO terminals, at the LO frequency, there are no remarkable differences in the three configurations, and the same LO impedance, equivalent to that of one diode, is inherent in all; that is, $Z_{LO}=Z_D$ where $Z_D$ is the impedance of a single diode at the LO frequency.

Figure 8A:
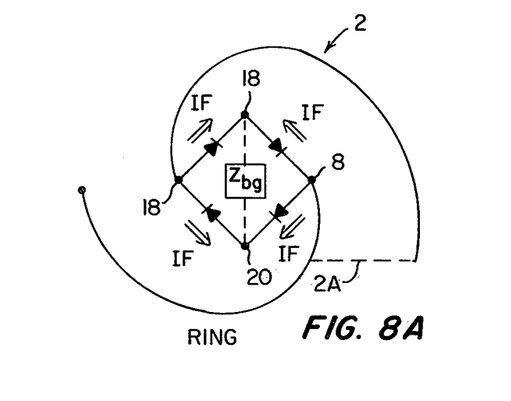
FIGS. 8A, 9A and 10A are diagrammatic representations of the IF signal terminal pairs for the RING, BLO and BRO diode quad configurations shown in FIGS. 5A, 5B and 5C, respectively.
Figure 8B:
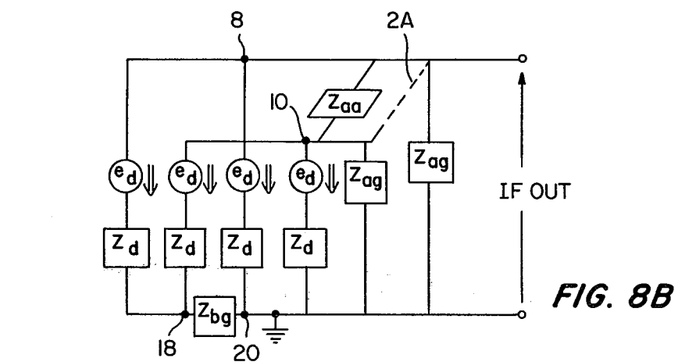
FIGS. 8B, 9B and 10B are circuit diagrams showing IF equivalent circuits for the diode quad configurations shown in FIGS. 8A, 9A, and 10A, respectively.

FIGS. 8A and 8B; 9A and 9B; and 10A and 10B are representations of the IF schematics for the RING, BLO and BRO diode quad configurations, respectively.

Thus, for the RING configuration (FIGS. 8A, 8B), it is clear that maximum available power output requires that the IF be taken between terminal pairs 18, 20 and 8, 10. Terminals 8, 10 can be connected by joining the spiral arms at the rim of antenna 2 as shown by 2A in FIG. 8A. This has a negligible effect on RF operation of the antenna if the active region is on the interior and suitable RF loading lies between the active region and the periphery. The junction of terminals 18 and 20 can be accomplished in some kinds of balun; or any circuit which provides a low impedance at IF frequency and a high impedance between these points at LO frequencies. This IF impedance is designated as $Z_{bg}$. The IF output impedance of the circuit is $Z_d/4$, where $Z_d$ is the IF impedance of a single diode and $e_d$ is the magnitude of the voltage developed across a single diode. Limitations of this circuit include the behavior of the balun center conductor to ground impedance $Z_{bg}$ and the spiral antenna arm to ground impedance $Z_{ag}$. Without a low $Z_{bg}$, the circuit will operate, but at reduced efficiency. If $Z_{ag}$ becomes a sufficiently low impedance at the desired IF, a resonating circuit may be necessary to prevent short circuiting of the outputs.

Figure 9A:
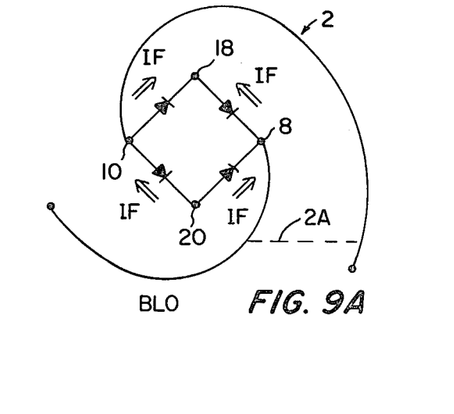
Figure 9B:
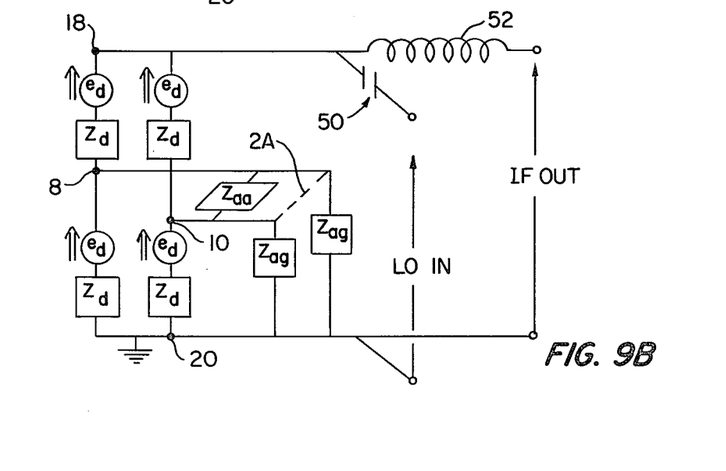

With particular reference to FIGS. 9A and 9B, the IF equivalent circuit for the BLO configuration is shown wherein the IF is developed between terminals 18 and 20 (the LO terminals). Suitable filter elements such as capacitor 50 and inductor 52 (FIG. 9B) separate the IF and LO signals. Distributed filter elements such as coupled sections of transmission line are also suitable for this diplexing operation. The BLO configuration is significant because its IF output behavior is more heavily dependent on the filter elements than on the spiral IF impedances $Z_{aa}$ and $Z_{ag}$, making wide band IF operation possible. It is noted that in the worst case of $Z_{ag}$ being a very low impedance at some IF frequency, the IF response to the BLO configuration should fall off less than 3db if the filter response is level. This is not the case with the RING configuration as heretofore described, wherein the frequency response of $Z_{ag}$ is directly across the IF output. In the BLO configuration, a balun with high $Z_{bg}$ at the IF is chosen, eliminating the impedance from the circuit. It is also noted that by Thevenin's equivalent, the nominal IF impedance of the BLO configuration is $Z_d$, or four times that for the RING configuration. It also appears that the LO IN/IF OUT can be made a single transmission line back to the location of the filter elements, thus making it unnecessary to have an IF cable at the outer periphery of the spiral antenna, as is otherwise the case.

Figure 10A:
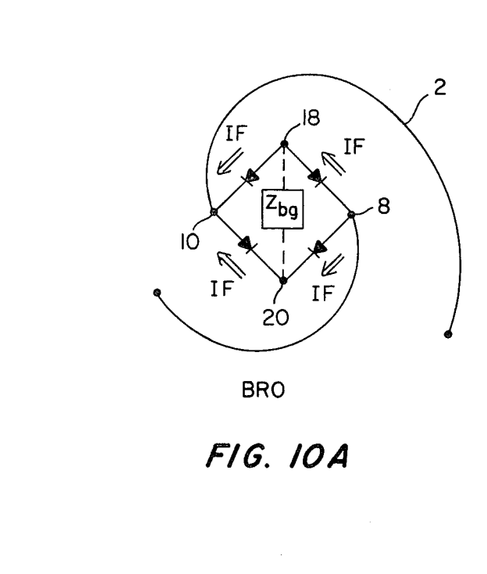
Figure 10B:
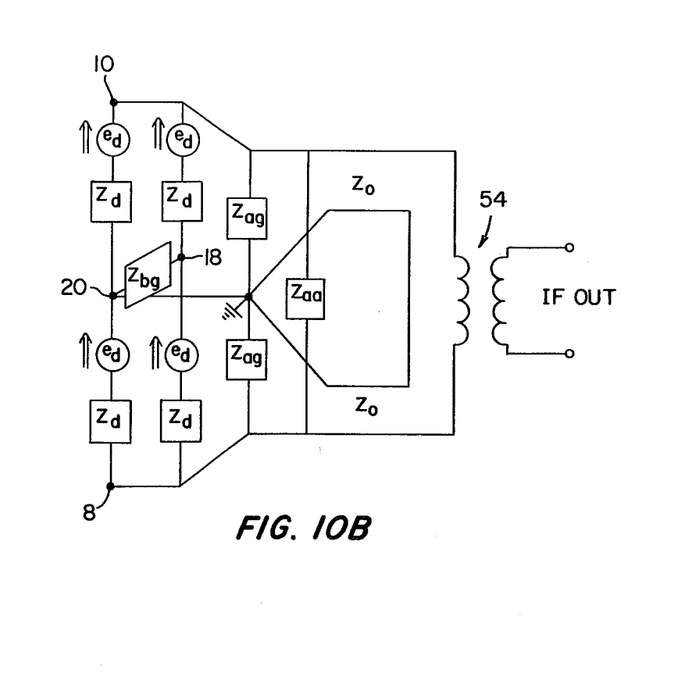

The BRO configuration shown in FIGS. 10A and 10B illustrates the possibility of a two cable balanced IF output feeding a balanced transformer 54. This circuit has the disadvantage of including the frequency dependent loads $Z_{ag}$ and $Z_{aa}$ directly across the IF output, but, on the other hand, the IF output is independent of the behavior of $Z_{bg}$.

Consideration will finally be given to the RF ports of the RING, BLO and BRO diode quad configurations. Thus, because of the spiral properties and the space orthogonality of feeds which effectively isolate the RF terminals at the inside of the spiral antenna from the IF terminals and the LO terminals, the equivalent circuits are similar to the LO port configurations of FIGS. 7A, 7B and 7C. In all three cases, the load on the spiral by the diode quad is $Z_d$ if the quad is balanced, as is the case.

What is claimed is:

1. A mixer for converting a radiated radio frequency input signal into an intermediate frequency output signal with the aid of a local oscillator signal, comprising:
    an antenna including a pair of arms and a pair of balanced feed terminals each of which is connected to a corresponding arm, with the antenna receiving the radiated radio frequency input signal;
    a balun including a pair of conductors and a pair of balanced feed terminals orthogonally disposed with respect to the antenna terminals, and each of the conductors connected to a corresponding balun terminal, with the balun carrying the local oscillator signal;
    a balanced diode quad disposed at an end of the balun and connected to the antenna terminals and the balun terminals;
    the diode quad providing broad band isolation between the radio frequency and local oscillator signals, and providing a phase relationship between said signals so that the intermediate frequency output signal is present on a selected combination of the antenna arms and the balun conductors;
    the balun and the antenna arms being arranged so that the plane of the antenna arms and the plane of the balun are perpendicular, whereby the local oscillator and radio frequency signals vector polarizations are in space quadrature; and
    the space quadrature of the signal vector polarizations and the balance of the diodes in the diode quad being determinative of the isolation between the radio frequency and local oscillator signals.

2. A mixer as described by claim 1, wherein:
    the balun is a microstrip tapered balun, with one side of the balun being connected to an outer grounded conductor of a coaxial input cable;
    an inner conductor of the coaxial input cable is connected to another side of the balun; and the intermediate frequency signal is provided between the outer grounded conductor and the inner conductor.

3. A mixer as described by claim 10, wherein:
the balun and the antenna arms are arranged so that the plane of the antenna arms and the plane of the balun are perpendicular, whereby the local oscillator and radio frequency signal vector polarizations are in space quadrature; and
the space quadrature of the signal vector polarizations and the balance of the diodes in the diode quad being determinative of the isolation between the radio frequency and local oscillator signals.

4. A mixer as described by claim 1, wherein:
the antenna is a spiral antenna;
the diode quad is in a ring polarity; and
the intermediate frequency signal is taken from a coaxial cable coming from the periphery of the spiral.

5. A mixer as described by claim 1, wherein:
the antenna including a pair of arms is a spiral having a pair of inner ports and a pair of outer ports;
the impedance from arm to arm is non-uniform and the impedance from a single arm to ground is non-uniform; and
the spiral arranged so that when it is excited in a balanced mode between the pair of inner ports with a balanced load between the pair of outer ports an input impedance related to the arm to arm impedance in parallel with twice the arm to ground impedance is provided, and arranged so that when it is excited in an unbalanced mode with the pair of inner ports shorted and the pair of outer ports shorted, and a potential applied between the inner ports and ground with a load between the outer ports and ground, an input impedance related to one half the arm to ground impedance is provided.

6. A mixer as described by claim 1, wherein:
the intermediate frequency signal is present between the pair of antenna balanced feed terminals and the pair of balun balanced feed terminals, with the respective pairs of antenna and balun terminals each electrically connected as one terminal.

7. A mixer as described by claim 1, wherein
the antenna is a spiral antenna; and
the antenna terminals are DC connected by joining the antenna arms at the rim of the spiral.

8. A mixer as described by claim 1, wherein:
the diode quad is in a bridge polarity and is connected so that the intermediate frequency signal is provided between the antenna terminals; and
coaxial cables connect the outer extremities of the antenna arms to a balanced to unbalanced intermediate frequency transformer.

9. A mixer as described by claim 1, wherein:
the diode quad is in a bridge configuration and connected so that the intermediate frequency signal is provided between the balun terminals; and
frequency filter means separate the intermediate frequency signal from the local oscillator signal.

10. A mixer for converting a radiated radio frequency input signal into an intermediate frequency output signal with the aid of a local oscillator signal, comprising:
an antenna including a pair of arms and a pair of balanced feed terminals each of which is connected to a corresponding arm, with the antenna receiving the radiated radio frequency input signal;
a balun including a pair of conductors and a pair of balanced feed terminals orthogonally disposed with respect to the antenna terminals, and each of the conductors connected to a corresponding balun terminal, with the balun carrying the local oscillator signal;
a balanced diode quad disposed at an end of the balun and connected to the antenna terminals and the balun terminals;
the diode quad providing broad band isolation between the radio frequency and local oscillator signals, and providing a phase relationship between said signals so that the intermediate frequency output signal is present on a selected combination of the antenna arms and the balun conductors;
the diode quad being in a bridge polarity and connected so that the intermediate frequency signal is provided between the antenna terminals; and
coaxial cables connecting the outer extremities of the antenna arms to a balanced to unbalanced intermediate frequency transformer.

11. A mixer as described by claim 10, wherein:
the balun is a microstrip tapered balun, with one side of the balun being connected to an outer grounded conductor of a coaxial input cable;
an inner conductor of the coaxial input cable is connected to another side of the balun; and
the intermediate frequency signal is provided between the outer grounded conductor and the inner conductor.

12. A mixer as described by claim 10, wherein:
the antenna including a pair of arms is a spiral having a pair of inner ports and a pair of outer ports;
the impedance from arm to arm is non-uniform and the impedance from a single arm to ground is non-uniform;
the spiral arranged so that when it is excited in a balanced mode between the pair of inner ports with a balanced load between the pair of outer ports an input impedance related to the arm to arm impedance in parallel with twice the arm to ground impedance is provided, and arranged so when it is excited in an unbalanced mode with the pair of inner ports shorted and the pair of outer ports shorted, and a potential applied between the inner ports and ground with a load between the outer ports and ground, an input impedance related to one half the arm to ground impedance is provided.

13. A mixer as described by claim 10, wherein:
the antenna is a spiral antenna; and
the antenna terminals are DC connected by joining the antenna arms at the rim of the spiral.

* * * * *